United States Patent [19]
Banerjee et al.

[11] Patent Number: 5,502,670
[45] Date of Patent: Mar. 26, 1996

[54] SINGLE CYCLE FLUSH FOR RAM MEMORY

[75] Inventors: Pradip Banerjee; Atul V. Ghia, both of San Jose; Simon Lau, Fremont, all of Calif.

[73] Assignees: Sony Corporation; Sony Electronics, Inc., Park Ridge, N.J.

[21] Appl. No.: 346,739

[22] Filed: Nov. 30, 1994

[51] Int. Cl.$^6$ .................................................. G11C 7/00
[52] U.S. Cl. ............................. 365/230.06; 365/194
[58] Field of Search ........................... 365/189.01, 194, 365/203, 156, 900

[56] References Cited

U.S. PATENT DOCUMENTS 4,541,073  9/1985  Brice et al. ........................ 365/185
4,616,344  10/1986  Noguchi et al. ................... 365/194
4,989,182  1/1991  Mochizuki et al. ................ 365/194

Primary Examiner—Tan T. Nguyen
Attorney, Agent, or Firm—Irell & Manella

[57] ABSTRACT

The present invention provides methods and apparatus for resetting all of the cells in a random access memory (RAM) during one clock cycle without requiring ancillary drivers. At the start of the reset cycle, each column in the memory array is selected to receive the reset value and then each data line in the array is driven low while the inverse of the data line is driven high. After a first predetermined delay, each word line is driven high and all of the memory cells are thus reset. The word lines are then driven low and after a second predetermined delay, the data lines are driven back to a high value. In this manner, each cell in the memory array is reset during one clock cycle.

20 Claims, 4 Drawing Sheets

SINGLE CYCLE FLUSH FOR RAM MEMORY

BACKGROUND OF THE INVENTION

1. Field of the Invention

The invention relates to a digital computer memory and, more specifically, to a random access memory (RAM) that may be reset or flushed in one clock cycle.

2. Art Background

Random access memories (RAM) are common devices used in computers and many other digital systems. Often, it is desirable to reset or flush an entire block of RAM to the same value, either a zero or a one. A computer program may access an area of RAM on the assumption that it contains only zeros while a previous program may have filled the area with various values. Thus, upon program initialization, the memory area must be reset. Other examples also exist where an area of memory must be set to the same value for proper system operation.

Due to the structure of RAM, prior art methods of resetting an area of RAM to one value are time intensive or require an increase in the size of the memory. A RAM is typically in the form of a rectangular array where each memory location comprises a bit which is accessed individually through its row address and column address. A bit in the RAM is accessed during one clock cycle, and, due to power limitations, the bits must be accessed individually. Thus, since each bit must be individually reset and only one bit is accessed per clock cycle, it requires N×M clock cycles to reset a memory array with N rows and M columns, or N×M bits. Thus, to reset a large memory array requires a large amount of computer time, which slows the operation of the computer system.

Another prior art method resets all of the bits in a RAM in one cycle by adding a large driver transistor to every column in the RAM memory. The prior art techniques that reset all of the bits in a RAM in one cycle require a relatively large amount of power and thus require this additional transistor in every column. The addition of these driver transistors also increases memory size and power consumption.

As will be described, the present invention overcomes the limitations of the prior art by providing a method and apparatus for resetting all of the bits in a RAM memory array to one value during a single clock cycle, without increasing the size of the memory.

SUMMARY OF THE INVENTION

The present invention provides methods and apparatus for resetting all of the cells in a random access memory (RAM) during one clock cycle. At the start of the reset cycle, each column in the memory array is selected to receive the reset value, and at least one data line in the array is driven low while the corresponding data line is maintained high. After a first predetermined delay, each word line is driven high and all of the memory cells are thus reset. After the reset, the word lines are driven low and, after a second predetermined delay, the data lines are driven back to a high state. The present invention includes circuitry to rapidly drive the data lines to a low state during the reset cycle, and to rapidly drive the data lines back to a high state after the memory cells have been reset.

DETAILED DESCRIPTION OF THE INVENTION

The present invention discloses methods and apparatus having particular application for resetting a random access memory (RAM) block in one clock cycle. Although the present invention is described with reference to specific circuits, block diagrams, and signals, etc., it will be appreciated by one of ordinary skill in the art that such details are disclosed simply to provide a more thorough understanding of the present invention. It will therefore be apparent to one skilled in the art that the present invention may be practiced without these specific details. In other instances, well known circuits are shown in block diagram form in order not to obscure the invention unnecessarily.

Figure 1:
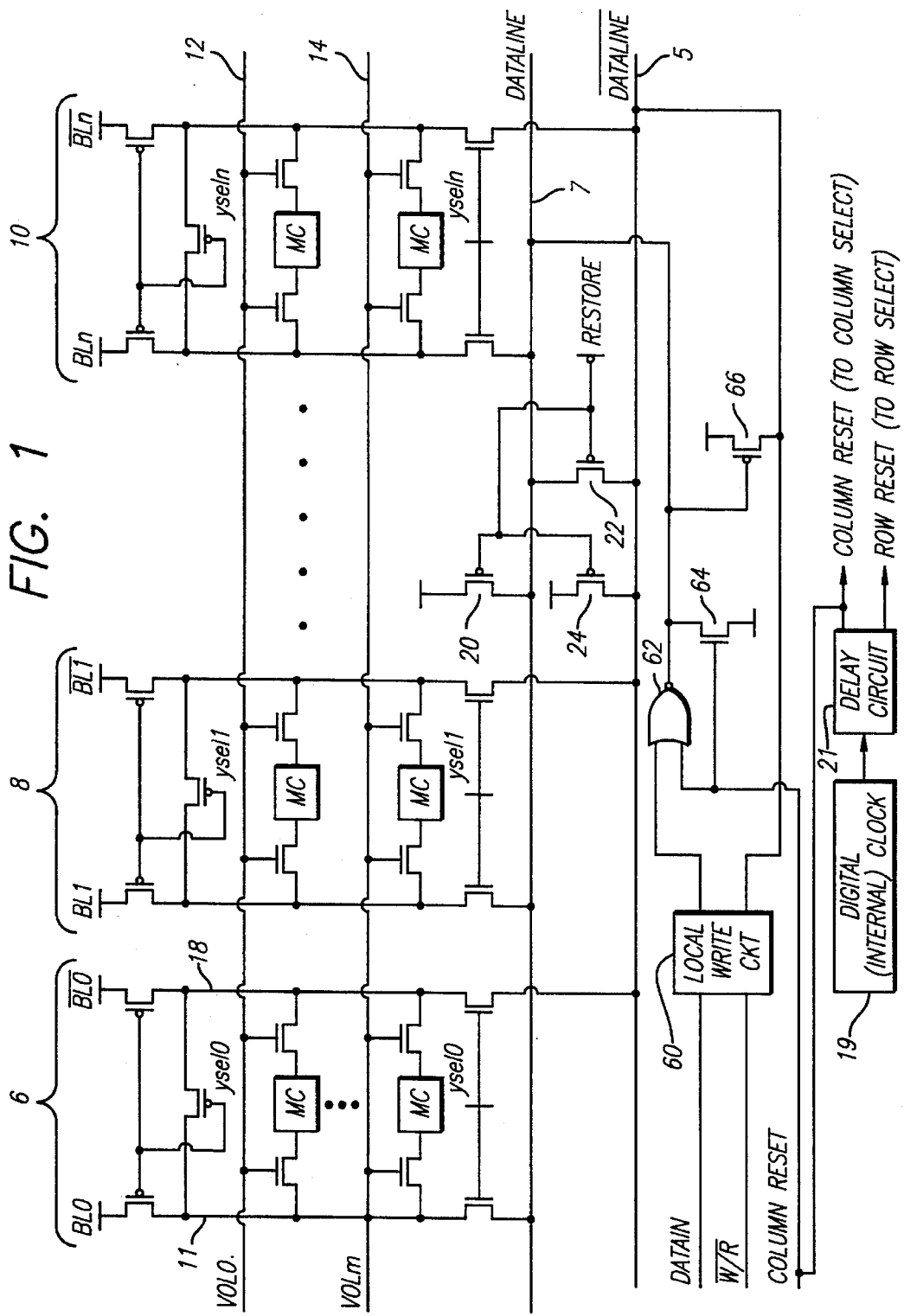
FIG. 1 is a RAM memory array utilizing the teachings of the present invention.

FIG. 1 illustrates a RAM array in accordance with the teachings of the present invention. As shown in FIG. 1, the RAM comprises M rows (or word lines) including word lines 12 and 14, and N columns, including columns 6, 8 and 10. Each column is associated with a bit line ("BL") and a bit line inverse ("$\overline{BL}$"). For example, column 6 is associated with BL 11 and $\overline{BL}$ 18. To write data to a particular bit, or cell, in memory, a signal with the requested address is provided to a row decoder (not shown) and a column decoder (not shown). The row decoder drives the word line of the address being written to high, and the column decoder precharges the BL and $\overline{BL}$ of the column of the addressed cell. A data line 7 and a $\overline{\text{data line}}$ 5 are coupled to the BL and $\overline{BL}$ of each column. If a logical "one" is to be written to the desired address, the data line 7 is driven high while the $\overline{\text{data line}}$ 5 is driven low. Conversely, if a logical "zero" is to be written to the desired address, the data line 7 is driven low value while $\overline{\text{data line}}$ 5 is driven high.

Also shown in FIG. 1 is a digital clock 19 coupled to a delay circuit 21, which provides column reset and row reset signals as will be hereinafter described.

The method of the present invention writes a logical "zero" or a logical "one" to each bit in the RAM array during one clock cycle. A novel timing mechanism allows the write to occur without the addition of driver transistors. At the start of a reset cycle, all of the columns are selected and the data line and $\overline{\text{data line}}$ are provided with the appropriate values, depending upon whether a "zero" or a "one" is being written to each bit in the array. Without loss of generality, it is assumed herein for purposes of description that each bit will be set to a "zero" so that the data line is driven low at the start of a reset cycle.

After a predetermined period, while the data line is still driven low, and the BL's are correspondingly low, the word lines are driven high and a "zero" is thus written into every bit in the memory array. Subsequently, the word lines are all driven low while the BL's are still low and the data line is still driven low. After a predetermined delay, the data line is again driven high. In this manner, an entire memory array is set or reset in one clock cycle.

By providing the appropriate values to the BL and $\overline{BL}$ before driving the word lines high, the BL and $\overline{BL}$ lines are not loaded and the amount of current is correspondingly less than if the word lines were turned on before the appropriate BL's or $\overline{BL}$'s. The relatively smaller current eliminates the necessity for large driver transistors and decreases the time necessary to write to the memory cells.

Figure 2A:
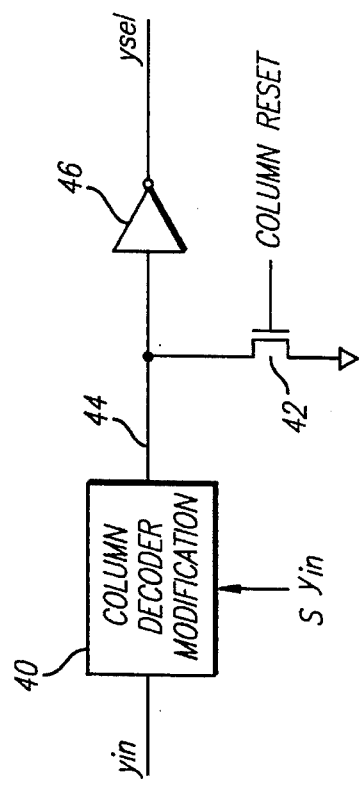
FIG. 2a illustrates a word line decoder of the present invention to drive all of the word lines to a high state during a portion of a reset cycle.

To provide all the word lines and column lines with a high value, each output line of the row decoder and column decoder must be driven high. FIG. 2a illustrates a circuit that does not affect the operation of the word line decoder except during a set or reset cycle, when the circuit is capable of driving all of the lines of the decoder high. FIG. 2a illustrates the circuit for one output line 55 of the decoder 50. In practice, each output line of word line decoder 50 is configured identically to that shown in the figure but only one output line is shown for clarity.

As illustrated in the figure, an output line 55 of word line decoder 50 is coupled to a MOS transistor 52 and an inverter 54. The gate of the MOS transistor 52 is provided with a row reset signal that drives the word lines during a reset cycle. When the row reset signal provided to the gate of transistor 52 is driven low, the voltage on the word lines is determined by the decoder 50, as in normal operation. When the signal provided to the gate of transistor 52 is high, during the appropriate period of the reset cycle, line 55 is driven low and the output of inverter 54 is accordingly driven high. The high value at the output of inverter 54 is provided to the word line corresponding to line 55. Thus, all of the word lines are provided with a high value, and the memory cells may be written to, when the gate of transistor 52 is provided with a high value.

Figure 2B:
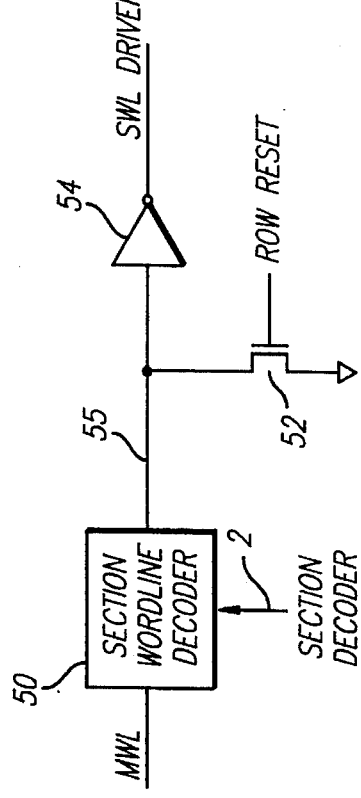
FIG. 2b illustrates a column decoder of the present invention to drive all of the columns to a high state during a portion of the reset cycle.

As illustrated in FIG. 2b, a similar circuit is used with respect to the decoding of column information. The figure illustrates one output line 44 of column decoder 40 for purposes of clarity. In practice, each output line of column decoder 40 is configured identically to line 44 as shown in the figure. Line 44 is coupled to a MOS transistor 42 and an inverter 46 such that when a column reset signal provided to the gate of transistor 42 is high, line 44 is driven low and the output of inverter 46 is accordingly high. Thus, the column corresponding to line 44 is selected for writing. Similarly, all of the output lines of column decoder 40 are low such that all of the column lines are opened for a write operation.

Figure 2C:
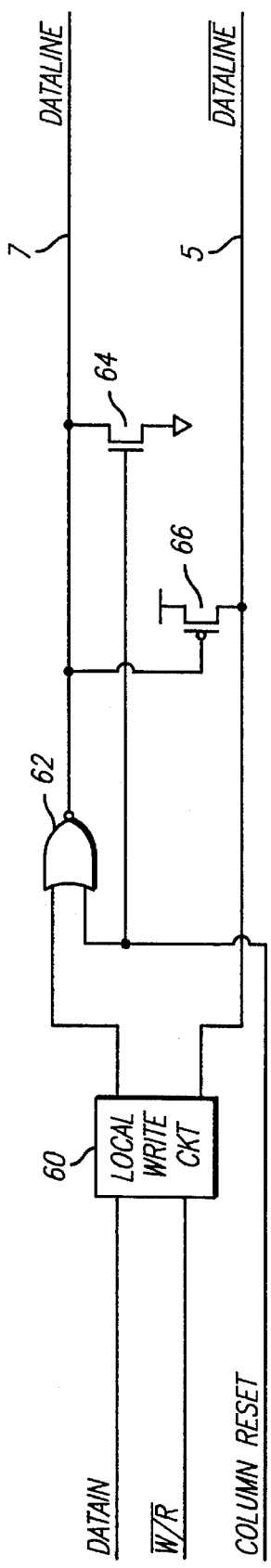
FIG. 2c illustrates a portion of the data line write circuitry of FIG. 1 that drives a data line low during part of the reset cycle.

FIG. 2c illustrates the circuitry that provides the data lines with the value to be written to the memory cells during the reset cycle. Local write circuit 60 is coupled to circuit elements that do not affect the value of the data line 7 and $\overline{data\ line}$ 5 during normal operation but drive the data line 7 and $\overline{data\ line}$ 5 to the desired values during a portion of the reset period. As shown in the figure, local write circuit is coupled to NOR gate 62 and NOR gate 62 also receives the column reset signal provided to the gate of transistor 42 as shown in FIG. 2b. The column reset signal is also provided to the gate of MOS transistors 64 to quickly change the value of the data line 7 once the column reset signal goes high. Before the column reset signal goes high, both data line 7 and $\overline{data\ line}$ 5 are in a high state. When the column reset signal is in high state, the data line 7 is driven low while the inverse of the data line is kept high, such that a zero will be written to the memory cells during the reset cycle.

As shown, the gate of P-type transistor 66 is coupled to data line 7 and the drain of P-type transistor 66 is coupled to $\overline{data\ line}$ 5 to maintain the high state on $\overline{data\ line}$ 5 when data line 7 changes from a high state to a low state. To help drive the data line 7 back to a high state after the memory cells are reset, a restore signal that is at a high value is applied to the gates of P-type MOS transistors 20, 22 and 24 as shown in FIG. 1. It will be appreciated that the circuit arrangement as shown in FIG. 2c could be inverted such that the data line 7 is high and the $\overline{data\ line}$ 5 is low during the set cycle such that a "one" would be written to the memory cells during the set cycle.

Figure 3:
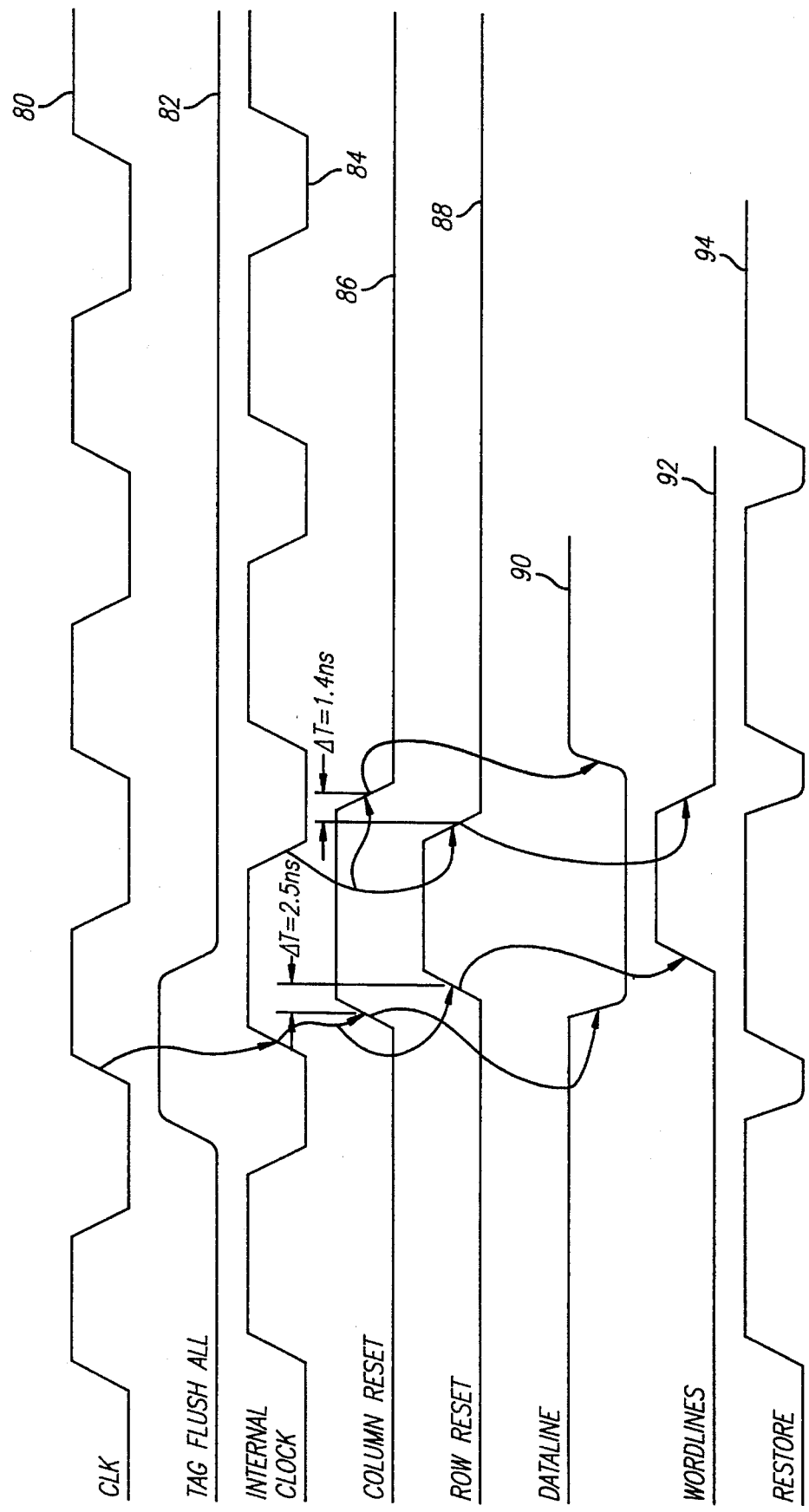
FIG. 3 is a timing diagram of the signals generated in accordance with the present invention.

FIG. 3 is a timing diagram for the single cycle reset of the present invention. A clock signal 80 is provided by a system clock that controls the timing of the computer system that includes RAM memory. A signal 82 is provided by a controller (not shown). If the signal 82 is driven high when the system clock signal 80 is high, a reset cycle is initiated. Signal 84 is a signal that changes from a low state to a high state shortly after signal 80 changes from a low state to a high state but has a duty cycle that is independent of the duty cycle of the system clock signal 80.

As previously described, signal 86 is the column reset signal provided to the gate of transistor 42 as illustrated in FIG. 2b. Signal 86 is derived from signal 84, as will be described more fully below. A signal 88 is the signal provided to the gate of word line transistor 52, as previously described. Signal 88 changes from a low state to a high state after a predetermined delay from the time when signal 86 changes from a low state to a high state, as shown. In a preferred embodiment, this delay is 2.5 nanoseconds. Of course, the optimal delay will depend on the number and type of circuit components employed in the memory. Signal 88 returns to a low state after a first specified predetermined delay, and signal 86 returns to a low state after a second predetermined delay. In a preferred embodiment, this delay is 1.4 nanoseconds. As previously discussed, the optimal delay will depend on the number and type of circuit components employed in the memory. The circuitry to derive signals 86 and 88 will be discussed below.

Still with reference to FIG. 3, signal 90 is the voltage on data line 7 and is derived from signal 86. The $\overline{data\ line}$ signal, not shown, remains in a high state during the entire reset cycle. Signal 92 is derived from signal 88 and illustrates the signal provided to the word lines. Finally, signal 94 represents the restore signal that is provided to the gates of transistors 20, 22 and 24 as illustrated in FIG. 1, and assists in driving the data line 7 high after the memory cells have been reset.

As illustrated in FIG. 3, the data line 7 is driven low and, after a specified period, the word lines are all driven high for a specified period. After the word lines are driven low, the data lines are driven high after a specified period. In this manner, the cells of the memory array are all reset with a low value during one clock cycle without a large increase in the size of the memory.

In a preferred embodiment, the present invention derives signals 84 as shown in FIG. 3 from the system clock signal 80. A copending application entitled "Duty Cycle Independent Tunable Clock", Ser. No. 08/334,687, filed Nov. 4, 1994, by the same inventors of the present invention, provides methods and apparatus for deriving clock signals of selected duty cycles from a system clock, and is herein incorporated by reference. As described in the above referenced copending application, an internal clock signal 20 may be tuned to any desired duty cycle. The tunable internal clock signal 20 as illustrated in the copending application corresponds to the signal 84 of the present application.

Figure 4:
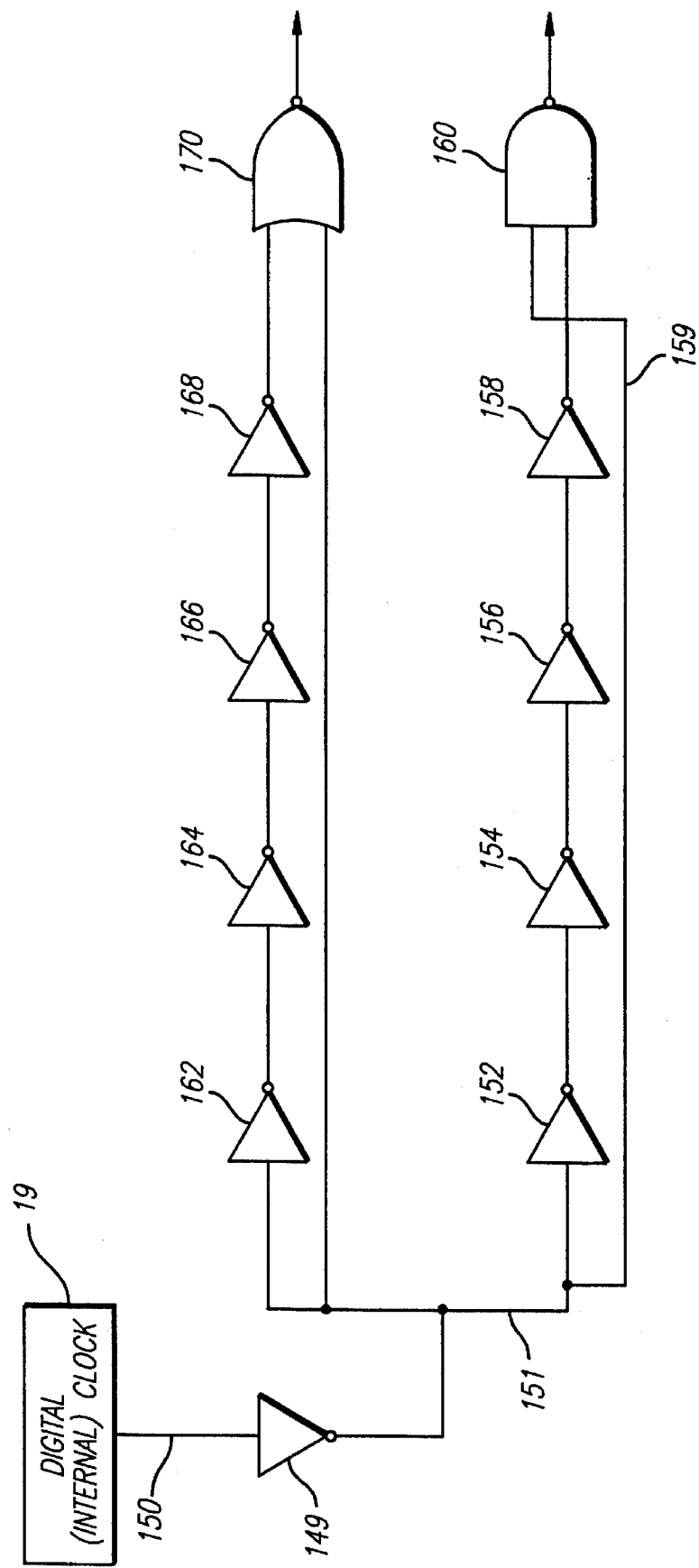
FIG. 4 is a delay circuit for deriving one of the signals of FIG. 3.

Signals 86 and 88 are derived from signal 84. FIG. 4 illustrates the delay circuit 21 to derive signal 86 from signal 84. As illustrated in the figure, the signal over line 150 corresponds to signal 84 and is generated by the internal clock 19 of the copending application where the internal clock 19 is tuned to provide desired pulse width for signal 84. To derive the column reset signal 86 from signal 84, signal 84 is provided over line 150 to inverter 149, which is coupled to inverters 152, 154, 156 and 158 and directly to NAND gate 160. Inverter 158 is also coupled to NAND gate 160 over line 153.

When the internal clock signal 84 over line 150 is driven low, line 151 is high and thus the output of NAND gate 160 is low. When the internal clock signal 84 over line 150 changes from low to high, and tag_flush_all is sampled "high," a flush cycle is initiated and line 151 changes to a low state which is provided to the NAND gate 160. The output of NAND gate 160, corresponding to the column reset signal, changes from low to high. After a delay caused by inverters 152, 154, 156 and 158, the other input of NAND gate 160 changes to a low value. When the internal clock signal 84 over line 150 changes from a high state to a low state, line 151 changes to a high state which is provided to NAND gate 160. However, the low state provided to NAND gate 160 by inverter 158 does not change to a high state until the high state over line 151 propagates through inverters 152, 154, 156 and 158. Thus, the output of inverter 160, the column reset signal, remains in a high state for a period after the internal clock signal over line 150, corresponding to signal 84 in FIG. 3, changes from high to low.

As shown in FIG. 4, the row reset signal 88 is derived from the internal clock signal with a NOR gate 170 and inverters 162, 164, 166 and 168. When the internal clock signal over line 150, corresponding to signal 84 in FIG. 3, is in a low state, line 151 is in a high state and both inputs to NOR gate 170 are high. The output of NOR gate 170, corresponding to the row reset signal 88, is accordingly low. When the internal clock signal over line 150 changes from a low state to a high state, the low state over line 151 is immediately provided to NOR gate 170. However, the other input of NOR gate 170 remains high because of the delay caused by inverters 162, 164, 166 and 168. Thus, the output of NOR gate 170 does not change from low to high until after a delay determined by inverters 162, 164, 166 and 168. When the internal clock over line 150 changes from a high state to a low state, the high state over line 151 is provided to NOR gate 170 which accordingly changes from high to low. In this manner, the row reset signal 88 is derived from the clock signal 84, as illustrated in FIG. 3.

As will be appreciated by a person of ordinary skill in the art, there are numerous alternate methods and apparatus for providing the signals as shown in FIG. 3, based upon the invention disclosed in the copending application or other methods.

While the invention has been described in conjunction with the preferred embodiment, it is evident that numerous alternatives, modifications, variations and uses will be apparent to those skilled in the art in light of the foregoing description. For example, the invention may be applied to systems that use transistor-transistor-logic (TTL) circuits. Many other adaptations of the present invention are possible.

We claim:

1. A method for writing a specified value to a plurality of cells in a digital memory, the digital memory including one or more word lines and one or more data lines coupled to the plurality of cells, the method comprising the steps of:

changing the value over at least one of the data lines from a first value to a second value; and changing the value over at least one of the word lines from a third value to a fourth value after the step of changing the value over at least one of the data lines, thereby writing a value in at least one of said plurality of cells according to said second value over said at least one of the data lines.

2. The method according to claim 1 further comprising the steps of:

changing the value over the at least one of the word lines from the fourth value to the third value; and changing the value over the at least one data lines from the second value to the first value after the step of changing the value over the at least one of the word lines from the fourth value to the third value.

3. The method according to claim 2 wherein the step of changing the value over at least one of the data lines from a first value to a second value is performed after an internal clock signal derived from a system clock signal changes from a low value to a high value and wherein the duty cycle of the internal clock signal is independent of the system clock signal.

4. The method according to claim 3 wherein:

the step of changing the value over at least one of the data lines from a first value to a second value includes the step of generating a column reset signal from the internal clock signal; and the step of changing the value over at least one of the word lines from a third value to a fourth value includes the step of generating a row reset signal from the internal clock signal.

5. The method according to claim 4 wherein the step of generating the column reset signal from the internal clock signal includes:

providing a first version of the internal clock signal to a logic gate; and providing a second version of the internal clock signal to the logic gate after a predetermined delay after the step of providing said first version of the internal clock signal to the logic gate.

6. The method of claim 5 wherein the logic gate comprises a NAND gate and the predetermined delay is effected by a plurality of inverters.

7. The method according to claim 4 wherein the step of generating the row reset signal from the internal clock signal includes:

providing a first version of the internal clock signal to a logic gate; and providing a second version of the internal clock signal to the logic gate after a predetermined delay after the step of providing the first version of the internal clock signal to the logic gate.

8. The method of claim 7 wherein the logic gate comprises a NOR gate and the predetermined delay is effected by a plurality of inverters.

9. The method according to claim 1 where the step of changing the value over at least one of the data lines from a first value to a second value corresponds to writing a zero to the plurality memory cells.

10. A method for writing a specified value to a plurality of cells in a digital memory, the digital memory including one or more word lines and one or more bit lines coupled to the plurality of cells, the method comprising the steps of:

changing the value over at least one of the bit lines from a first value to a second value; and changing the value over at least one of the word lines from a third value to a fourth value after the step of changing the value over at least one of the bit lines, thereby writing a value in at least one of said plurality of cells according to said second value over said at least one of the data lines.

11. The method according to claim 10 wherein the step of changing the value over at least one of the bit lines further comprises the step of providing at least one of the bit lines with a digital clock signal.

12. The method according to claim 11 wherein the step of changing the value over at least one of the word lines further comprises delaying the digital clock signal.

13. A digital memory with a plurality of memory cells comprising:

one or more word lines coupled to the plurality of cells;

one or more data lines coupled to the plurality of cells;

one or more bit lines coupled to the one or more data lines;

a digital clock coupled to the one or more data lines, the digital clock changing the voltage on the one or more data lines during a memory reset cycle; and a delay circuit coupled to the digital clock and further coupled to one or more of the word lines such that one or more of the word lines enables access to the plurality of cells after the voltage on the one or more data lines changes during a memory reset cycle.

14. The digital memory of claim 13 wherein the delay circuit comprises a first plurality of inverters.

15. The digital memory of claim 14 wherein the delay circuit further comprises a NOR gate with two inputs, one input of the NOR gate coupled to the first plurality of inverters and the other input of the NOR gate coupled to the digital clock.

16. The digital memory of claim 15 wherein:

the data lines are coupled to the digital clock by a NAND gate with two inputs and a second plurality of inverters;

the second plurality of inverters are coupled to the digital clock and one input of the NAND gate; and the other input of the NAND gate is coupled to the digital clock.

17. The digital memory of claim 13 further comprising:

a column decoder with one or more output lines for selecting a bit line; and at least one transistor coupled across one of the output lines and ground, the gate of the transistor coupled to the digital clock such that when the digital clock changes the voltage at the gate during a memory reset cycle, the output line is selected.

18. The digital memory of claim 13 further comprising:

a row decoder with one or more output lines for selecting a word line; and at least one transistor coupled across one of the output lines and ground, the gate of the transistor coupled to the digital clock such that when the digital clock changes the voltage at the gate during a memory reset cycle, the output line is selected.

19. The digital memory of claim 13 further comprising:

a local write circuit with an input and an output; and a NOR gate with two inputs, one of the inputs coupled to the output of the local write circuit and the other input coupled to the digital clock, the output of the NOR gate coupled to the one or more data lines.

20. The digital memory of claim 19 further comprising at least one transistor coupled across the one or more data lines and ground, the gate of the transistor coupled to the digital clock.

* * * * *